US 6,577,146 B2

(12) United States Patent
Gamache et al.

(10) Patent No.: US 6,577,146 B2
(45) Date of Patent: Jun. 10, 2003

(54) METHOD OF BURNING IN AN INTEGRATED CIRCUIT CHIP PACKAGE

(75) Inventors: Roger G. Gamache, Essex Junction, VT (US); David L. Gardell, Fairfax, VT (US); Marc D. Knox, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,539

(22) Filed: Apr. 25, 2001

(65) Prior Publication Data
US 2002/0175694 A1 Nov. 28, 2002

(51) Int. Cl.[7] .............................................. G01R 31/02
(52) U.S. Cl. .................................................... 324/760
(58) Field of Search ............................ 324/760; 374/43

(56) References Cited

U.S. PATENT DOCUMENTS

| 4,696,578 A | | 9/1987 | Mansuria et al. ............. 374/45 |
| 4,713,612 A | * | 12/1987 | Takamine .................... 324/767 |
| 5,164,661 A | | 11/1992 | Jones ........................ 324/158 |
| 5,420,521 A | * | 5/1995 | Jones ........................ 165/80.4 |
| 5,491,610 A | | 2/1996 | Mok et al. ................... 361/695 |
| 5,587,882 A | | 12/1996 | Patel ......................... 361/705 |
| 5,821,505 A | | 10/1998 | Tustaniwskyj et al. ........ 219/494 |
| 5,844,208 A | | 12/1998 | Tustaniwskyj et al. ........ 219/494 |
| 5,864,176 A | | 1/1999 | Babock et al. ............... 257/714 |
| 5,907,246 A | | 5/1999 | Abraham et al. ............. 324/760 |
| 5,911,897 A | | 6/1999 | Hamilton ..................... 219/497 |
| 5,918,665 A | | 7/1999 | Babcock et al. .......... 165/104.33 |
| 6,091,062 A | * | 7/2000 | Pfahnl et al. ................ 219/209 |
| 6,092,927 A | | 7/2000 | Clemente .................... 374/163 |
| 6,198,630 B1 | * | 3/2001 | Cromwell .................... 165/80.3 |
| 6,238,086 B1 | * | 5/2001 | Mikubo et al. ............... 374/43 |
| 6,389,225 B1 | * | 5/2002 | Malinoski et al. ........... 219/494 |

* cited by examiner

Primary Examiner—N. Le
Assistant Examiner—John Teresinski
(74) Attorney, Agent, or Firm—William N. Hogg

(57) ABSTRACT

An improved method of burn-in of I/C chips is provided wherein, at the beginning of the burn-in process, the thermal resistance between the heatsink and the chip is measured at reduced power, the maximum allowable thermal resistance between the chip and heatsink interface is calculated and compared to the actual thermal resistance of the interface. If the actual thermal resistance measured at the interface between the heatsink and the chip package is greater than the maximum allowable calculated thermal resistance, then the corrective action is initiated in order to prevent damage to the I/C chip during burn-in or increase efficient use of the test sites.

6 Claims, 2 Drawing Sheets

US 6,577,146 B2

METHOD OF BURNING IN AN INTEGRATED CIRCUIT CHIP PACKAGE

BACKGROUND OF THE INVENTION

1. Field of the Invention

This invention relates generally to burn-in procedures for integrated circuit chip packages and, more particularly, to a method for controlling burn-in of integrated circuit chips to prevent damage to the chip by excessive heat build-up resulting from applied power during the burn-in procedure.

2. Background Information

In the manufacture of integrated circuit chips and integrated circuit chip devices or packages, one of the final procedures performed on the chip or chip package is final burn-in and testing. It is important to note that powers seen during burn-in are rapidly increasing over time. Increase in device power over time is attributed to increased static leakage current per device corresponding to CMOS technology advancement. This is a trend that follows technology. The burn-in and testing is generally done on a plurality of chips in chip packages mounted in a fixture. The burn-in procedure usually takes many hours and includes subjecting each of the chips or chip packages to relatively high voltages and temperatures. The high voltage results in high power levels during burn-in. The burn-in procedure is necessary in order to assure good quality chips; thus, relatively stringent or aggressive parameters are set for both the chip voltage delivered to each chip and the temperature environment encountered by each chip during burn-in.

Because of these very aggressive standards, it is necessary that they not be exceeded or damage likely will result to the chips. This is especially true of the temperature to which the chip is to be heated. For example, it is common for the test parameters of the chip to be set at 120° C. plus or minus 5° C. If during testing the temperature of the chip exceeds the maximum allowable temperature, i.e. about 125° C. in this case, a relatively high likelihood of damage to the chip is the result, thus damaging a chip that would otherwise be a good and serviceable chip if tested within the temperature parameters set by the test. In some cases, the burn-in test equipment has over temperature and over voltage protection. However, even when these are present, and they actuate, this burn-in station is rendered non-functioning, and thus the chip at this station is not burned-in. This results in a lower equipment efficiency. Hence, it is desirable to have as many stations as possible operating.

One contributing factor to the temperature encountered by the chip during the test procedure is the thermal resistance between the chip and a heatsink used in the testing device. Thermal resistance between the chip and the heatsink can vary from test position to test position of the various chips or chip packages being tested in a single test fixture. There are many causes for this variation in thermal resistance at the interface between the heatsink and the chip. For example, differences in surface finish or flatness of the various heatsinks for each individual chip package can cause significant variation in thermal resistance; also, different surface finish or flatness of the back side of the chip which is in contact with the heatsink can also cause differences in the thermal resistance. Other causes of high thermal resistance include foreign bodies, such as dust or other particles at the interface. Moreover, different size I/C chip packages and heatsinks will have different thermal resistance at their interfaces. Too high a thermal resistance at the interface between the heatsink and the chip can result in thermal heating of the chip above allowable limits, thus destroying what might otherwise be a perfectly good chip. Therefore, it is desirable to provide a technique of preventing excessive heating of an I/C chip during burn-in.

BRIEF SUMMARY OF THE INVENTION

According to the present invention, an improved method of burn-in of I/C chips is provided wherein at the beginning of the burn-in process, the thermal resistance between the heatsink and the chip is measured at reduced power (theoretically, the thermal resistance is independent of the power level), the maximum allowable thermal resistance between the chip and heatsink is calculated and compared to the actual thermal resistance of the interface. If the actual thermal resistance measured at the interface between the heatsink and the chip package is greater than the maximum allowable calculated thermal resistance, then the corrective action is initiated in order to prevent damage to the I/C chip during burn-in or increase efficient use of test sites.

DETAILED DESCRIPTION OF THE INVENTION

Figure 1:
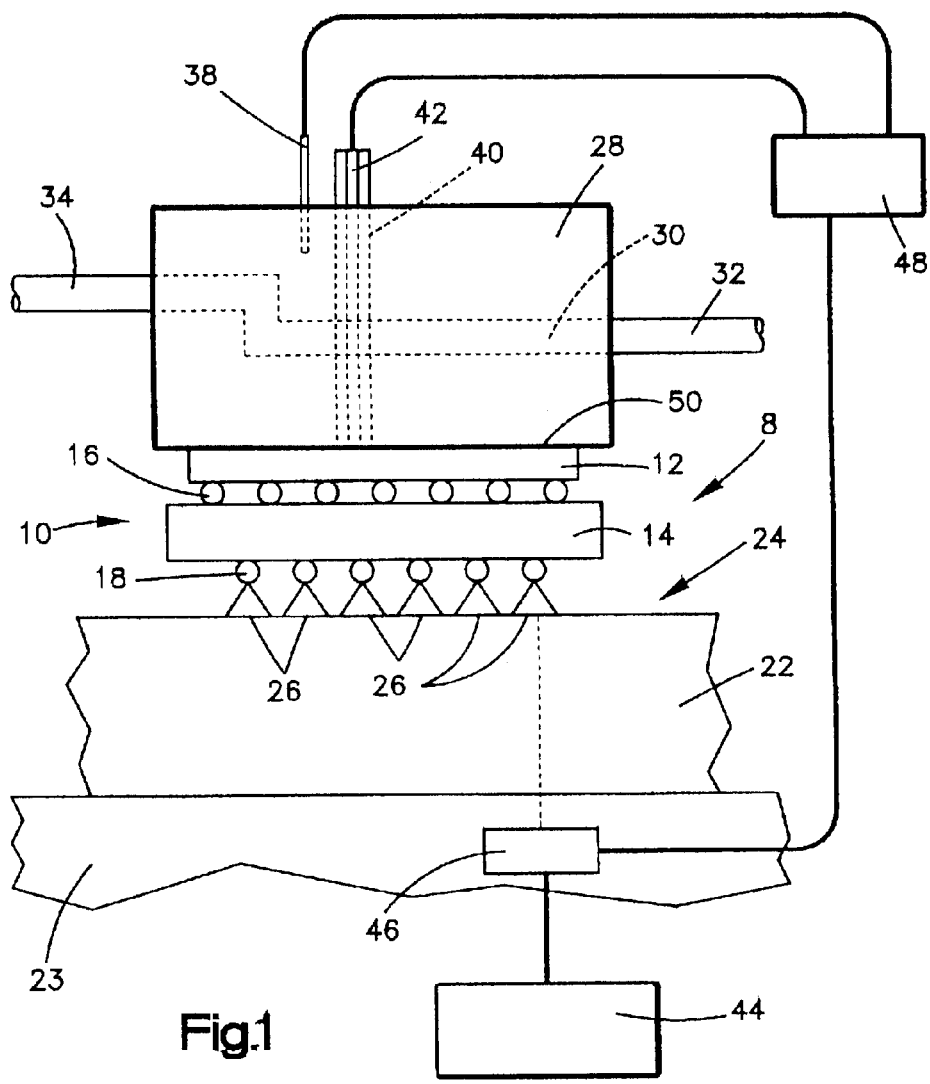
FIG. 1 is a somewhat schematic illustration of a burn-in test fixture for burning in and testing integrated circuit chip devices.

Referring now to the drawings and, for the present, to FIG. 1, a test fixture 8 is shown which is suitable for providing burn-in and testing of integrated circuit chip devices 10 (sometimes referred to as device under test (DUT) according to the present invention. The integrated circuit (I/C) chip packages typically include an integrated circuit chip 12 mounted to a dielectric chip carrier 14 by solder (C-4) connections 16. (Of course, I/C chips not mounted on chip carriers can also be subject to burn-in and testing.) The chip carrier 14 includes a ball grid array 18 which provides for power input and connects with the I/C chip 12 through circuitry and vias (not shown) on the chip carrier 14. As indicated earlier, the test fixture 8 normally has positions for many I/C chip packages or devices 10 but, for illustration purposes, only one position is shown in order to illustrate the present invention. It is to be understood, however, that each station has independent power contacts and heatsinks which will be described presently. Each socket normally holds a single substrate and a single device. This could be extended to multiple devices on a single substrate or multi-chip module. However, each socket/device/substrate has an associated power supply and the voltage/current monitors.

The test fixture 8 includes a socket or contactor 22. The contactor 22 is mounted to a burn-in board 23. The burn-in board 23 has a plurality of individual I/C chip package mounting sites, one of which is shown at 24. Each mounting site has power input contacts 26 to which power is supplied to the ball grid array 18 and, thus, eventually to the I/C chip 12. Each of the individual I/C chip package mounting stations 24 is provided with a heatsink 28 as a part of the test fixture 8. The heatsink 28 may or may not be fluid cooled, although it is generally preferred that the heatsink be fluid cooled to better control the heat dissipation characteristics of the heatsink 28. To this end, the heatsink 28 typically is provided with fluid passages, shown schematically at 30, with a fluid input 32 and a fluid output 34 (as used herein, the term "fluid" includes both liquid and gas). Thus, during testing, when the heatsink 28 is brought into contact with the chip 12 of the chip package 10, fluid can be introduced through the fluid passages 30 to cool the chip during testing.

The heatsink 28 is also provided with a heatsink temperature sensor 38. This typically is located adjacent a fluid passage 30 so as to sense the temperature of the fluid which can be regarded as the temperature of the heatsink. The heatsink 28 also has a through vertical opening 40 therein through which a chip heat sensor 42 extends into contact with the chip 12. Thus, with the sensors 38 and 42, both the temperature of the heatsink 28 and of the I/C chip 12 can be measured.

Alternate locations can be chosen for the reference temperature measurement of the thermal resistance calculation. For example, the thermal resistance could be calculated relative to the fluid temperature instead of the heatsink temperature R=(chip temperature-fluid temperature)/power. It is important to provide a consistent reference point or to correct for the differences between one reference point and another.

A power source 44 is provided to supply power to each of the individual I/C chip package mounting sections 24 and a power sensor 46 (watt meter) is provided for each location which will sense both the voltage and the current supplied thereto and, from this, can be calculated the watts or power supplied to the chip. The heatsink temperature sensor 38, the I/C chip package sensor 42 and power sensor 46 are connected to a computer 48 for a purpose which will be described presently.

In order to practice the present invention, it is necessary to know the maximum temperature to which the I/C chip 12 can be heated safely and a maximum power which is supplied to each chip 12 during the burn-in procedure. By knowing the maximum temperature to which the integrated circuit chip 12 can be heated and the maximum power input to each integrated circuit chip package (DUT), a maximum allowable thermal resistance at interface 50 between the chip 12 and the heatsink 28 can be calculated. For example, if the temperature to which the chip 12 is to be heated during burn-in is 120° C. plus or minus 5° C., and the maximum wattage to which the integrated circuit chip package 10 is to be subjected is 150 watts, and the heatsink temperature can be maintained at 25° C. (by fluid or some other means), the maximum thermal resistance that can be tolerated at the interface between the heatsink 28 and the chip 12 is equal to 125° C. minus 25° C. (ΔT), divided by 150 watts (w); i.e. 100° C. divided by 150 watts equals thermal resistance (TR) at interface 50 of 0.67° C. per watt $$\left[\frac{100° \text{ C.}}{150 \text{ watts}} = 0.67° \text{ C.}(TR)\right].$$

Thus, if the maximum temperature the chip can be heated to is 125° C. (i.e. 120° C. plus 5° C.), and the heatsink is maintained at 25° C., and the maximum power input to the chip is 150 watts, then the maximum permissible thermal resistance at the interface between the heatsink 28 and the chip 12 is 0.67° C. per watt.

If the thermal resistance between the heatsink 28 and the chip 12 is greater than 0.67° C. per watt, then during the burn-in procedure there is a probability of heating the chip to greater than 125° C. with the attendant increased likelihood of damage to a chip or inefficient use of tooling, which chip otherwise would have successfully completed burn-in and passed the test. Thus, according to the present invention, the initial part of the burn-in procedure provides a method of measuring the thermal resistance at the interface between each chip 12 and each heatsink 28 at reduced power and temperature levels, comparing this measured value to the allowable maximum thermal resistance, and if the measured value exceeds the allowable calculated maximum, correcting the condition that is causing the increased thermal resistance or not subjecting the chip to the remainder of the burn-in process.

This is accomplished in the following manner. Integrated circuit chip package 10 to be tested is loaded into its individual I/C chip package mounting section 24, with the power inputs 26 making contact with the ball grid array 18 of the chip carrier 14. The heatsink 28 is brought into contact with the back of the chip 12 and temperature in the heatsink is set to approximately 25° C. by controlling the temperature of the water flowing in the heatsink 28. Power is supplied from the power input 44 but at a level significantly lower than 150 watts, e.g., about one-half value, for example, 70–80 watts, and the temperatures of the heatsink 28 and the I/C chip 12 are allowed to stabilize. After stabilization, temperature measurements as well as the power input measurement are supplied to the computer 48. The actual thermal resistance at the interface 50 between the chip 12 and the heatsink 28 is calculated by subtracting the temperature of the heatsink 28 (THS), as measured by the heatsink temperature sensor 38, from the temperature of the integrated circuit chip 12 (TC), as measured by the sensor 42, (ΔT) and dividing ΔT by the measured power input (w). This value is then compared to the calculated maximum allowable value of the thermal resistance at interface 50 permitted for the particular DUT. If the calculated value of the thermal resistance for a DUT at the interface between the heatsink 28 and the chip 12 is greater than the maximum allowable calculated value, this device is not further subjected to burn-in under these conditions.

Sample calculations of actual measurements of the thermal resistance at the interface between the chip 12 and heatsink 28 are shown below. It is to be understood that these are just two representative samples.

Example 1—measured chip temperature –87° C. heatsink temperature measured –27° C. measured power to this chip — 80 watts Thus, thermal resistance at the interface can be calculated as follows: 87° C. minus 27° C. (ΔT) divided by 80 watts (w) equals 60° C. divided by 80 watts equals 0.75° C. per watt (TR).

$$\left[\frac{87° \text{ C.} - 27° \text{ C.}}{80 \text{ Watts}} = \frac{60° \text{ C.} -}{80 \text{ Watts}} = \frac{75°}{\text{Watt}}\right].$$

This is greater than the calculated maximum allowable thermal resistance of 0.67 watts per degree centigrade and, thus, this chip should not be subjected to the burn-in procedure at 150 watts and 120° C. plus or minus 5° C. Example 2—measured chip temperature –67° C. heat sink temperature –27° C. power measured to this chip –72 watts The thermal resistance is then calculated as follows: 67° C. minus 27° C. (ΔT) divided by 72 watts (w) equals 40° C. divided by 72 watts equals 0.55° C. per watt (TR)

$$\left[\frac{67° \text{ C.} - 27° \text{ C.}}{72 \text{ Watts}} = \frac{40° \text{ C.} -}{72 \text{ Watts}} = \frac{55° \text{ C.}}{\text{Watt}}\right].$$

Since this value is less than the calculated maximum allowable value of 0.67° C. per watt, this chip can be subjected to the continued burn-in and testing process without concern that the I/C chip 12 will be overheated past the maximum allowable value as a result of power of 150 watts being applied during the burn-in cycle.

Several procedures can be taken to prevent the continued testing and burn-in of a chip 12 that does not meet the standard. For example, the chip can be removed from the fixture, the heatsink 28 and the surface of the chip 12 checked and cleaned to assure that there is no interference with the contact and the chip replaced, and the thermal resistance at the interface 50 recalculated. Alternatively, or if the thermal resistance at the interface still exceeds the maximum allowable after cleaning, the heatsink can be replaced, or the chip can be sent back for rework if necessary. Alternatively, it would be possible to just leave the chip in place and disable any further burn-in procedure on that chip location 24 and have the chip available for a later test and burn-in. In any event, if the thermal resistance at the interface between the heatsink 28 and the chip 12 is greater than the calculated allowable value, this chip should not be subjected to the remainder of the burn-in procedure, thus risking destruction of an otherwise good I/C chip 12 and/or socket 22.

Figure 2:
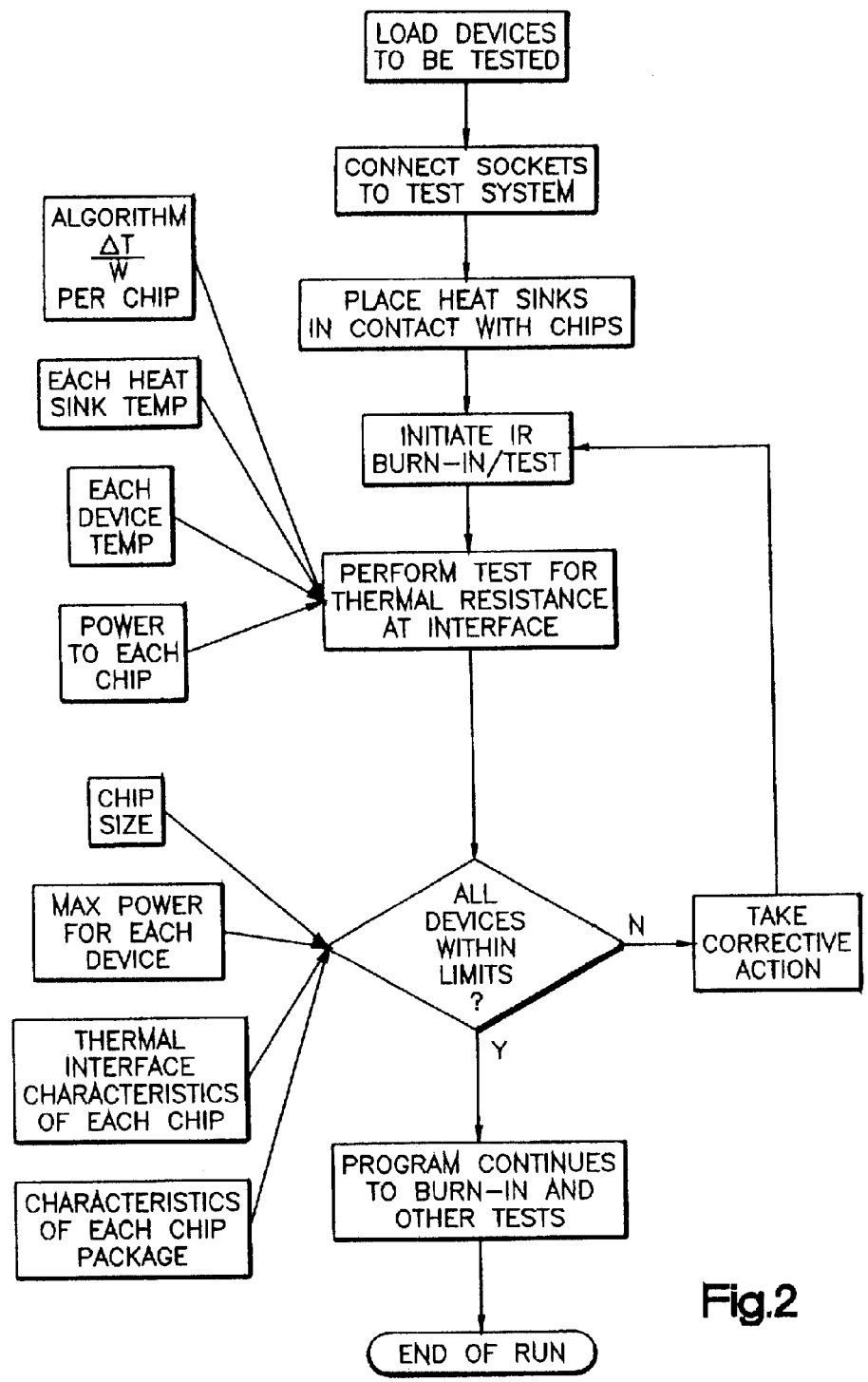
FIG. 2 is a flow diagram showing the steps of the present invention during the burn-in procedure.

FIG. 2 is a flow diagram of the burn-in procedure according to the present invention. As can be seen, the parts are loaded into sockets, the sockets connected to the power system, and the power system connected to the computer. The heatsink is placed to contact with each chip and the program is initiated to run each chip for initial testing to determine the thermal resistance of the interface 50 between the heatsink 28 and the chip 12. It should be noted that for each chip being tested, the maximum allowable thermal resistance of the interface has been calculated and loaded into the computer. A program then runs the initial step to perform, at low power, as described above, the test to determine the measured thermal resistance of each device. The computer compares the calculated maximum allowable value of the thermal resistance with the measured value for each chip to determine if the measured value for any chip is greater than the calculated maximum allowable value. (As used herein, the term "measured value of the thermal resistance" means all of the values needed for determining this value are measured. Of course, from these measured values, the thermal resistance is "calculated" as described above and the computer does this calculation.) If all chips are within limits, i.e., have a measured thermal resistance less than the calculated maximum allowable value, then the program proceeds to the next step where the actual burn-in tests are performed step by step until the end of the run.

However, if there is one or more chips that are not within performance limitation, i.e. that have a thermal resistance at the interface between the heatsink 28 and the chip 12 greater than the calculated maximum allowable value, this is noted and the test run is not continued. The necessary corrective action can be taken as described above. Once the corrective action has been taken, the first step is again initiated and this is repeated until all of the devices fall within the allowable limits of calculated thermal resistance or that chip section 24 is disabled. At that time and only at that time does the burn-in and test procedure continue.

Accordingly, the preferred embodiment has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of burning-in at least one I/C chip package in a test fixture which has a socket to receive at least one I/C chip package and a heat sink relatively movable into and out of contact with said I/C chip package, and a power source to provide power to said at least one I/C chip package and wherein the I/C chip package has a maximum power supplied during testing and a maximum temperature to which the chip can be heated during testing, comprising the steps of: determining the maximum allowable thermal resistance (TR) of an interface between the I/C chip package and the heat sink at said maximum power Level and said maximum temperature value; contacting the I/C chip package with said heat sink to create a thermal interface; applying power (w) to said I/C chip package at a known level below said maximum power level; measuring the temperature of said chip (TC) and the temperature of said heat sink (THS) and from said known level of power (w) and the measured chip temperature (TC) and the measured temperature of said heat sink (THS), calculating the actual thermal resistance (TR) of said interface; and continuing said burn-in if and only if said actual thermal resistance of said interface is equal to or less than said maximum allowable thermal resistance of said interface at each chip heat sink interface.

2. The invention as defined in claim 1 wherein the maximum allowable thermal resistance of the interface is calculated.

3. The invention as defined in claim 2 wherein said maximum allowable thermal resistance of the interface is calculated from the maximum allowable chip burn-in temperature, the temperature of the heatsink at ambient condition, and the maximum given burn-in power level.

4. The invention as defined in claim 3 wherein the thermal resistance (TR) is calculated by the formula $$\frac{TC - THS}{w} = TR.$$

5. The invention as defined in claim 2 wherein the thermal resistance (TR) is calculated by the formula $$\frac{TC - THS}{w} = TR.$$

6. The invention as defined in claim 1 wherein said I/C chip package is removed from contact with the heatsink if said measured value is greater than said allowable value.

* * * * *